United States Patent [19]

Nagao et al.

[11] Patent Number: 4,869,797
[45] Date of Patent: Sep. 26, 1989

[54] METHOD FOR PREPARING A MAGNETIC RECORDING MEDIUM

[75] Inventors: Makoto Nagao; Kunihiko Sano; Fusao Yamanaka; Akira Nahara, all of Kanagawa, Japan

[73] Assignee: Fuji Photo Film Co., Ltd., Kanagawa, Japan

[21] Appl. No.: 63,382

[22] Filed: Jun. 18, 1987

[30] Foreign Application Priority Data

Jun. 18, 1986 [JP] Japan .................... 61-140303

[51] Int. Cl.$^4$ ............................................. C23C 14/34
[52] U.S. Cl. ......................... 204/192.16; 204/192.15; 204/192.2
[58] Field of Search ............. 204/192.2, 192.15, 192.16

[56] References Cited

U.S. PATENT DOCUMENTS 4,428,810 1/1984 Webb et al. ................. 204/192.15 X
4,503,125 3/1985 Nelson et al. ....................... 428/408

OTHER PUBLICATIONS

Brian Chapman, Glow Discharge Processes, John Wiley & Sons, New York, 1980, pp. 215–227.
Leon I. Maissel et al., Handbook of Thin Film Technology, McGraw-Hill Book Co., New York, 1970, pp. 4-22 to 4-25.
Robert W. Berry et al., Thin Film Technology, Van Nostrand Reinhold Co., New York, 1968, pp. 230–233.
John L. Vossen et al., Thin Film Processes, Academic Press, New York, 1978, pp. 50–59.

Primary Examiner—John F. Niebling
Assistant Examiner—William T. Leader
Attorney, Agent, or Firm—Sughrue, Mion, Zinn, Macpeak & Seas

[57] ABSTRACT

A method of preparing a magnetic recording medium in which a magnetic layer is deposited on a non-magnetic support and then a carbon protective layer is sputtered onto the magnetic layer. The sputtering is performed with a bias voltage of −10V to −100V being applied in the vicinity of the support and magnetic layer.

7 Claims, 1 Drawing Sheet

METHOD FOR PREPARING A MAGNETIC RECORDING MEDIUM

BACKGROUND OF THE INVENTION

1. Field of the Invention

The present invention relates to a magnetic recording medium having a magnetic thin film as a magnetic layer. More particularly, it relates to a perpendicular magnetic recording medium having excellent running durability even under conditions at a high humidity.

2. Background of the Invention

There has recently been proposed a perpendicular magnetic recording system using a magnetic recording medium having an axis of easy magnetization perpendicular to the surface of the magnetic layer. This perpendicular magnetic recording system is said to be for the most part quite suitable for high density recording since, in this system, the higher the recording density becomes, the greater the reduction in the demagnetization field of a magnetic recording medium, resulting in an excellent reproduced output.

A magnetic recording medium of a thin metal film type having an axis of easy magnetization perpendicular to the surface of a magnetic layer thereof is needed to perform perpendicular magnetic recording. In this connection, there is known a magnetic recording medium of a thin metal film type comprising a support composed of non-magnetic materials such as a high molecular weight material (polymer) or a non-magnetic metal overlaid with a layer of a Co-Cr alloy deposited by a vapor deposition method, a sputtering method or an ion plating method and the like (hereinafter, these methods are referred to as "vacuum thin film forming method").

Also there is known a perpendicular magnetic recording medium of so called two layered type. In this recording medium, a layer of high magnetic permeability composed of soft magnetic materials such as, for example, a permalloy layer (Ni-Fe type alloy) underlies the perpendicular magnetic layer composed of Co-Cr alloy as described above. This structure improves the recording and reproducing efficiency during perpendicular magnetic recording and reproducing.

However, such a magnetic recording medium of a thin metal film type has serious problems of poor running durability and poor wear resistance. To solve the above problems, it has been proposed to provide a protective layer made of a thermoplastic resin or a thermosetting resin on a surface of a magnetic layer. However, the above proposal is not satisfactory because the thickness of the protective layer is limited due to a spacing loss between a head and a magnetic layer.

It is proposed in Japanese Patent Publication No. 33521/1979 that a carbon protective layer be provided by a vapor deposition method to improve wear resistance of a magnetic plated layer of a magnetic recording medium.

When such a carbon protective layer is provided on the magnetic recording medium of a thin metal film prepared by a vacuum thin film forming method, running durability under a normal humidity condition is improved. However, running durability is greatly degraded under long-term storage or under running conditions at a high humidity. That is, the bonding of a protective layer to a magnetic layer is reduced, for example, under a condition of 80% relative humidity, and the protective layer is easily peeled off or comes off in an extreme case. In this case, running is obliged to stop.

SUMMARY OF THE INVENTION

Thorough investigations have been undertaken as to bonding between a magnetic layer and a protective layer under high humidity conditions in a magnetic recording medium of a thin metal film provided with a carbon protective layer by a vapor deposition method. It was found that bonding can remarkably be improved, resulting in improving running durability of the magnetic recording medium under high humidity conditions by providing a carbon protective layer by a sputtering method using a charging bias voltage of from $-10V$ to $-100V$.

That is, the present invention relates to a method for preparing a magnetic recording medium which comprises forming at least a thin magnetic layer and a carbon protective layer on a non-magnetic support, wherein the carbon protective layer is prepared by sputtering with a bias voltage of from $-10V$ to $-100V$.

DETAILED DESCRIPTION OF THE INVENTION

Figure 1:
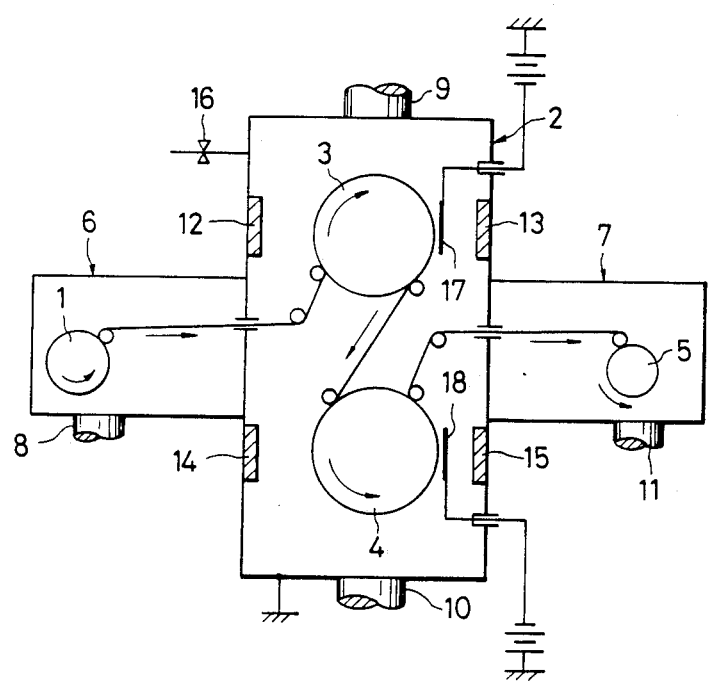
FIG. 1 is a schematic view of one apparatus for continuously sputtering both surfaces of a support.

The perpendicular magnetic recording medium of the present invention comprises a non-magnetic support on which a magnetic layer is deposited by a vacuum thin film forming method such as a vapor deposition method or a sputtering method. A carbon protective layer is deposited on the magnetic layer by a sputtering method.

A magnetic layer can be composed of a single layer of a ferromagnetic thin metal film mainly containing Co-Cr, Co-Ni, Co-Fe-Cr, Co-Cr-Ni, Co-Cr-Ta, Co-Cr-W, Co-Cr-Mo or Co-Cr-V. Alternatively, particularly in a perpendicular magnetic recording system, the magnetic layer can have a dual structure of a soft magnetic layer made of a permalloy alloy as an under layer and a perpendicular magnetic layer as an upper layer.

As a film-like support used in the present invention, high molecular weight materials (polymers) such as polyethylene terephthalate (PET), polyimide, polyamide, polyphenylene sulfide, polyether sulfone, polysulfone or the like are suitable. Among these, polyimide is preferred since it has excellent heat resistance.

These materials are also suitable for the support having an under layer. Furthermore, aluminum, silicon, glass and so on can be used as a support.

Additionally, it is preferred that a support is pretreated beforehand. For example, it is maintained under vacuum conditions, heat-treated or glow discharge treated so that impure gas discharged from the surface or inside of the support should be reduced.

As a material for a soft magnetic layer, not only a permalloy alloy such as Ni-Fe, Ni-Fe-Mo, Ni-Fe-Mo-Cu or the like may be used, but also alloys such as Fe, Fe-Al-Si, Fe-Ni-O, Fe-Ti, Ni-Fe-Cn-Cr-Mn, Fe-Si-B, Fe-B-C, Fe-Al, Co-V-Fe, Co-Ta, Co-Zr, Co-Nb-Zr, Co-Ti, Co-Nb-Ta, Co-Ni-Zr, Fe-Ni-P, Fe-Co-Zr, etc. can also be used.

The film thickness of the soft layer is preferably in the range from 0.03 to 5 micrometers so that deposition of an oligomer and discharge of impure gas from a film-like support should be prevented. The film thickness of from 0.1 to 1 micrometer is particularly preferred in order to obtain excellent characteristics of perpendicular magnetic recording and reproducing.

The thickness of a magnetic layer is about 0.03 to 5 micrometers, preferably from 0.05 to 1 micrometer.

As a means to form a layer, vapor deposition and sputtering methods are used, and a so-called continuous sputtering method or a so-called in line sputtering method having plural high speed sputtering sources installed around the plural cylindrical cans or drums are preferred. Various high speed sputtering sources are used in the present invention.

When a Co-Cr layer is formed, it is desirable that the temperature of a cylindrical can is raised to 90° C. or more in order to obtain a desired coercive force $H_c$ (perpendicular). It is particularly desirable that the temperature of the can is raised to 120° C. or more in order to obtain a perpendicular magnetic layer of coercive force $H_c$ (perpendicular).

As described above for the invention, a carbon protective layer is deposited by a sputtering method onto a magnetic layer. In this case, when sputtering is done with a charging bias voltage of from about $-10V$ to $-100V$, a carbon protective layer having excellent contact can be obtained and excellent running durability can be maintained even under highly humid conditions.

A charging bias voltage is used as follows. The sputtering method for forming a magnetic recording medium comprises charging the voltage of about 300V to 600V between a target and a can which supports, for example, a PET film in an atmosphere of argon gas of about $10^{-2}$ to $10^{-3}$ torr. Normally, a can is grounded and a voltage of from $-300V$ to $-600V$ is charged to the target. Because of the charging of the can, the argon gas strikes the target, a source of a material to be coated, thereby driving out the atoms from the target. The atoms are accelerated in the direction of the can and finally deposited on the medium film.

When bias voltage is charged in forming a carbon protective layer according to the present invention, bias voltage can be charged to the can or to a magnetic layer already formed on a support. Furthermore, a bias ring can be installed adjacent to the support so as to bias a desired voltage between the support and the bias ring. In the case that the bias voltage is applied to the can, it is necessary that the can should be released from the grounding system.

The bias voltage is preferably from $-10V$ to $-100V$ and good results cannot be obtained outside this range, as shown in the following Examples.

In the present invention, the above described protective layer should preferably have a thickness from about 5 to 50 nm.

In the present invention, the above described magnetic layer and the protective layer may be provided on both surfaces of a support or on only one surface thereof.

The present invention is described in more detail below illustrating the accompanying drawing showing one embodiment of one apparatus for manufacturing a magnetic recording medium having magnetic layers on both opposing surfaces of the support.

FIG. 1 is a drawing of a schematic view of one apparatus for continuously sputtering both surfaces of a support. For example, a rolled PET film is set on a supply reel 1 and is wound up by a take-up reel 5 after passing through intermediate rollers and cylindrical cans 3 and 4 which are installed in a vacuum chamber. The vacuum chamber is divided into three sub-chambers, that is, a supply chamber 6, a sputtering chamber 2 and a take-up chamber 7 with each of the sub-chambers 6, 2 and 7 separated by partitions. The sputtering chamber 2 is preferably conductive and grounded, and each sub-chamber is degassed at degassing opening 8, 9, 10 and 11.

In the sputtering chamber 2, a target 12 for preparing a perpendicular magnetic layer such as $Co_{80}$-$Cr_{20}$ and a carbon target 13 for preparing a surface protective layer are installed facing the first cylindrical can 3. A Co-Cr target 14 provides raw material for forming a perpendicular magnetic layer and a carbon target 15 provides raw material for preparing a protective layer. The targets 14 and 15 are installed facing the second cylindrical can 4.

The sputtering chamber 2 is degassed to $1 \times 10^{-6}$ torr or lower and thereafter Ar gas is introduced through a gas introducing port 16 to maintain the chamber 2 at about $3 \times 10^{-3}$ torr. Bias voltage of $-50V$ is charged to bias rings 17 and 18.

Instead of using the bias rings 17 and 18, the cans 3 and 4 can be negatively biased by a DC voltage source.

Under this condition, sputtering is carried out on one surface of a running PET film using the Co-Cr target 12 as a sputtering cathode to form, at first, a perpendicular magnetic layer and secondly a carbon protective layer using the carbon target 13 as another sputtering cathode. Sequentially, sputtering is conducted using the Co-Cr target 14 as a sputtering cathode to form a perpendicular magnetic layer on the other surface of the PET film and then to form a carbon protective layer using the carbon target 15 as a sputtering cathode. Thus, a film formed with magnetic layers and protective layers on both surfaces thereof is wound by the take-up reel 5.

The present invention is further illustrated by the following Example.

EXAMPLE

The perpendicular magnetic recording medium having the following composition was prepared using the apparatus as shown in FIG. 1.

| Composition | C | $Co_{80}$-$Cr_{20}$ | Polyimide | $Co_{80}$-$Cr_{20}$ | C |
|---|---|---|---|---|---|
| Thickness | 20 nm | 200 nm | 50 μm | 200 nm | 20 nm |

Sample carbon protective layers were prepared by charging $-20V$, $-90V$ and $-150V$ to the bias ring. The thus prepared samples were identified as A, B and C. The sample prepared without being charged was identified as D. A plural number of each sample were prepared. The thus obtained samples of a perpendicular magnetic recording medium were punched to form a disk having a diameter of 3.5 inches, which was then inserted into a jacket to obtain a floppy disk.

A test for running durability test was performed on these samples at an atmosphere of 30° C. and 80% relative humidity, using a commercially available floppy disk drive rotating at a speed of 600 rpm. The number of rotations until the disk samples failed was measured. This test was terminated at maximum passes of 10,000,000. The results of the tests are shown in FIG. 2.

Figure 2:
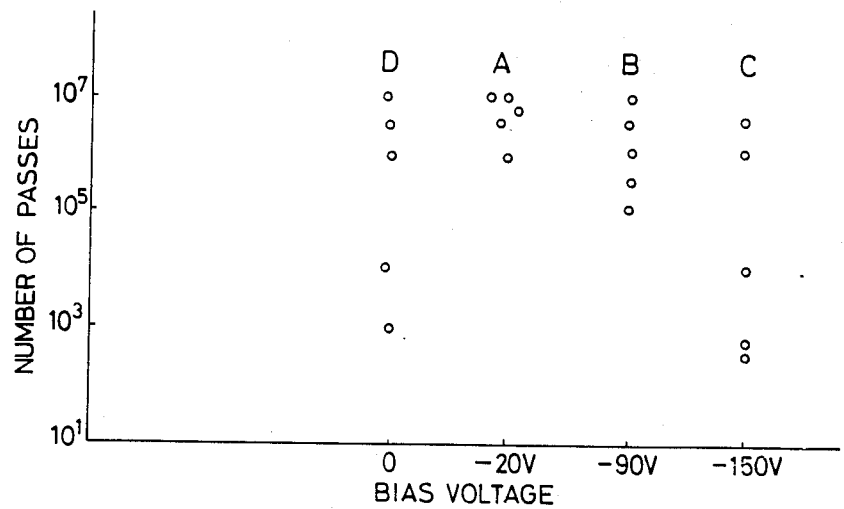
FIG. 2 is a graph showing the results of running durability tests.

As is clear from the results in FIG. 2, samples prepared without being charged and those prepared by being charged at −150 V exhibit variable running durability and poor reproducing property.

On the other hand, the samples of the present invention were run up to about 10,000,000 passes, exhibiting excellent durability and excellent reproducing property.

What is claimed is:

1. A method of preparing a magnetic recording medium, comprising the steps of:
   depositing a magnetic layer on a non-magnetic support;
   sputtering a carbon layer on said magnetic layer; and
   applying a DC bias voltage to a bias ring during said sputtering, said bias voltage being in a range of from −10 volts to −100 volts, said support having said magnetic layer being wound on a conductive drum, said bias ring being adjacent to said carbon layer and intermediate between said carbon layer and a sputtering target.

2. A method as recited in claim 1, wherein said range of said bias voltage is −20 volts to −90 volts.

3. A method as recited in claim 1, wherein said carbon layer has a thickness in a range of 5 nanometers to 50 nanometers.

4. A method as recited in claim 5, wherein said magnetic layer has a thickness in a range of 0.03 micrometers to 5 micrometers.

5. A method as recited in claim 6, wherein said range of said thickness of said magnetic layer is 0.05 micrometers to 1 micrometers.

6. A method as recited in claim 5, further comprising the step of:
   maintaining a temperature of said drum above 90° C.

7. A method as recited in claim 6, wherein said maintaining step maintains said temperature above 120° C.

* * * * *